(12) United States Patent
Siemieniec et al.

(10) Patent No.: US 8,946,787 B2
(45) Date of Patent: Feb. 3, 2015

(54) REDUCED CHARGE TRANSISTOR

(71) Applicant: Infineon Technologies Austria AG, Villach (AT)

(72) Inventors: Ralf Siemieniec, Villach (AT); Cedric Ouvrard, Villach (AT)

(73) Assignee: Infineon Technologies Austria AG, Villach (AT)

( * ) Notice: Subject to any disclaimer, the term of this patent is extended or adjusted under 35 U.S.C. 154(b) by 13 days.

(21) Appl. No.: 13/646,688

(22) Filed: Oct. 6, 2012

(65) Prior Publication Data

US 2014/0097478 A1    Apr. 10, 2014

(51) Int. Cl.
*H01L 29/80*    (2006.01)

(52) U.S. Cl.
USPC ............................................. 257/256; 257/77

(58) Field of Classification Search
CPC ............ H01L 29/8083; H01L 29/0843; H01L 29/1066; H01L 29/1608; H01L 29/8605; H01L 27/0883
USPC ................... 257/107, 256, 77, 110, 119, 124, 257/E29.104
See application file for complete search history.

(56) References Cited

U.S. PATENT DOCUMENTS

2002/0167011 A1*  11/2002  Kumar et al. .................. 257/77

\* cited by examiner

*Primary Examiner* — Yu-Hsi D Sun
*Assistant Examiner* — Christina Sylvia
(74) *Attorney, Agent, or Firm* — SpryIP, LLC

(57) ABSTRACT

Representative implementations of devices and techniques provide a reduced charge transistor arrangement. The capacitance and/or charge of a transistor structure may be reduced by minimizing an overlap of a top gate with respect to a drain of the transistor.

26 Claims, 9 Drawing Sheets

REDUCED CHARGE TRANSISTOR

BACKGROUND

A charge may form within a transistor structure during operation of the transistor, based on the capacitance of the structure, for example. With some transistors, such as with some junction-field-effect transistor (JFET) devices, regions of electric charge may develop within the devices when the arrangement of the device structure includes elements arranged such that they have a capacitive result. For example, a charge may develop between the gate and the drain or the gate and the source of the transistor device.

A charge formed within the transistor device may have undesirable effects, particularly as the charge increases in magnitude. For example, a larger charge between the gate and the drain may slow the device switching times. Additionally, when the ratio of the electric charge between the gate-to-drain and the gate-to-source becomes too large, the device may be triggered to turn on unexpectedly. Thus, the performance of the transistor device may be limited based on accumulating charge within the device.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

For this discussion, the devices and systems illustrated in the figures are shown as having a multiplicity of components. Various implementations of devices and/or systems, as described herein, may include fewer components and remain within the scope of the disclosure. Alternately, other implementations of devices and/or systems may include additional components, or various combinations of the described components, and remain within the scope of the disclosure.

DETAILED DESCRIPTION

Overview

Representative implementations of devices and techniques provide a reduced charge transistor arrangement. The gate-to-drain charge, for example, and/or the gate-to-drain capacitance of a transistor structure may be reduced by minimizing an overlap of a top gate structure with respect to a drain of the transistor.

In one implementation, a top gate is arranged together with a back gate to deplete the channel of the transistor when a preset voltage is applied between the gate and the source of the transistor. The top gate may be arranged to overlap at least a portion of the back gate to pinch-off the channel. However, in an implementation, the top gate may be arranged so that it does not fully overlap a region of the transistor overlying the drain. The amount of overlap of the top gate over the drain region determines the gate-to-drain capacitance of the transistor, as well as the gate-to-drain charge that may be formed.

Various implementations and arrangements of a transistor device are discussed in this disclosure. Techniques and devices are discussed with reference to example quasi-vertical junction field-effect transistor (JFET) devices illustrated in the figures. However, this is not intended to be limiting, and is for ease of discussion and illustrative convenience. The techniques and devices discussed may be applied to any of various transistor device designs, structures, and the like (e.g., metal-oxide-semiconductor FET (MOSFET), metal-insulator-semiconductor FET (MISFET), metal-semiconductor FET (MESFET), insulated-gate FET (IGFET), insulated-gate bipolar transistor (IGBT), etc.), as well as other semiconductor devices (e.g., semiconductor diodes, etc.), and remain within the scope of the disclosure. For ease of discussion, the generic term "transistor" is used herein for all such devices.

Implementations are explained in more detail below using a plurality of examples. Although various implementations and examples are discussed here and below, further implementations and examples may be possible by combining the features and elements of individual implementations and examples.

Example Transistor Structure

Figure 1:
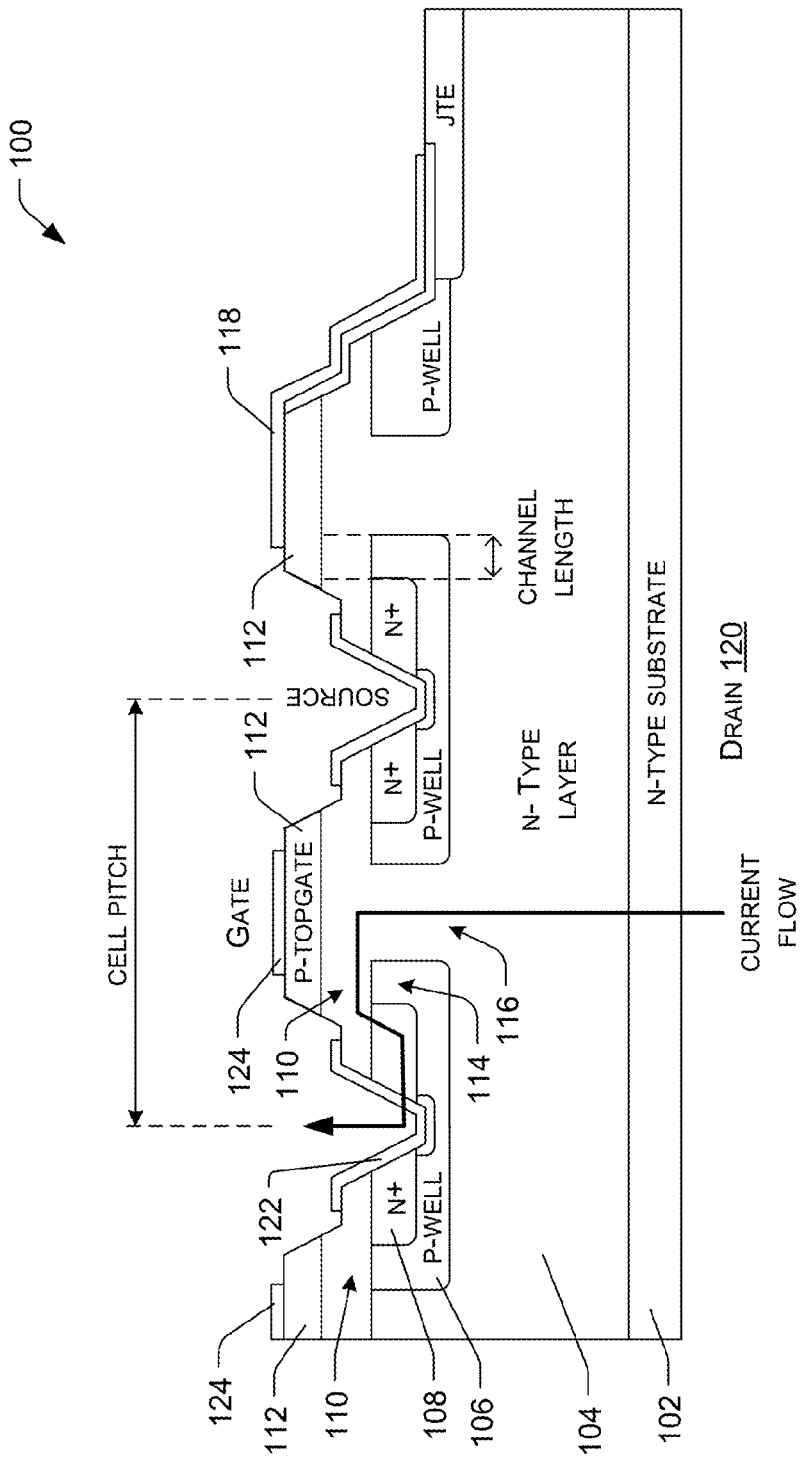
FIG. 1 is a profile view of a portion of an example transistor structure having multiple cells, according to an implementation. The portion of the example transistor structure is shown to highlight detail at cells of the transistor structure.

FIG. 1 is a perspective view of a portion of an example transistor structure 100 having multiple cells, according to an implementation. The illustration of FIG. 1, from left to right, shows a half transistor cell, a full transistor cell, a termination region cell, and a junction termination extension (JTE) at an edge of the transistor structure 100. The techniques, components, and devices described herein with respect to the transistor structure 100 are not limited to the illustration in FIG. 1, and may be applied to other transistor structure designs without departing from the scope of the disclosure. In some cases, fewer, additional, or alternative components may be used to implement the techniques described herein. It is to be understood that a transistor structure 100 may be implemented as stand-alone device or as part of another system (e.g., integrated with other components, systems, etc.).

The illustrated transistor structure 100 in FIG. 1 is shown and described as including one or more transistor "cells." A transistor cell may include one or more transistor devices, depending on the components included in the cell. An example cell is shown bounded by dashed lines that describe the pitch of an example cell (from one source contact to the next source contact, for example). A transistor structure 100 may contain one cell or multiple cells. In some implementations, multiple cells may be used together in a transistor structure 100 to minimize cost and die area while maximizing the channel density of the transistor structure 100. In various implementations, a transistor structure 100 may be comprised of multiple cells that are arranged in rows, matrices, and the like. Accordingly, cells may have various shapes, including strips, polygons, and so forth. In some implementations, cells may have irregular shapes.

In various implementations, a transistor device included in a cell may include a substrate layer 102, a drift region 104 (also referred to as a mass, bulk, etc.), a well region 106, a source region 108, a channel region 110, a top gate 112, a back gate 114, a current flow region 116 of the drift region 104, one or more metallization layers 118, a drain region 120, a source contact 122, a gate contact 124, and the like. In alternate implementations, a transistor device may include alternate or additional components, or may have different boundaries.

In various implementations, many of the components of a transistor structure 100 may be comprised of a p-type or an n-type semiconductor material, for example. In the implementations, the source region 108, channel region 110, drift region 104, and the substrate 102 may be comprised of the same type of semiconductor material (possibly at different doping levels). The top gate 112 and back gate 106 may be comprised of an opposite type of semiconductor material (possibly at different doping levels). The semiconductor materials may, for example, include regions of silicon, germanium, silicon carbide, gallium nitride, or another material having semiconducting properties. In some implementations, the source contact 122 and the gate contact 124 are a conductive material, such as a metal, for example.

Figure 2A:
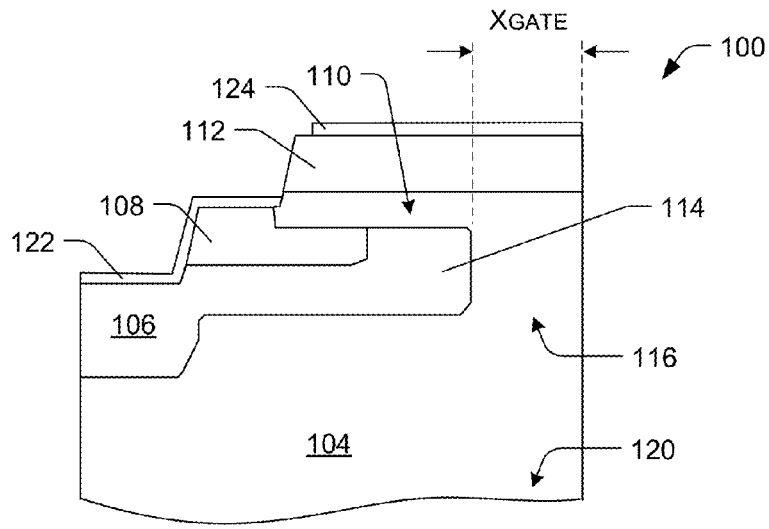
FIG. 2A is a profile view of a portion of the example transistor structure of FIG. 1, according to an implementation. The illustration of FIG. 2A represents one half of a transistor cell.

FIG. 2A is a profile view of a portion of the example transistor structure 100 of FIG. 1, according to an implementation. The illustration of FIG. 2A represents one half of a transistor cell, for example, enlarged to show some detail. Not all components from FIG. 1 are illustrated in FIG. 2A for clarity and ease of discussion. The example transistor structure 100 of FIGS. 1 and 2A shows a quasi-vertical arrangement. For example, some of the components of the transistor structure 100 are arranged in a vertical manner (e.g., the drain 120, substrate 102, drift region 104, well 106, source region 108, and gate 124) and other components are arranged in a more lateral manner (e.g., the channel 110 and source contact 122). This is an example, and not intended to be limiting. In alternate implementations, the transistor structure 100 may be arranged in various different configurations, and remain within the scope of the disclosure.

If included, the substrate layer 102 may be in electrical contact with the drain 120 and the drift region 104. For example, the substrate layer 102 may have the same doping type as the drift region 104. In the drawing of FIG. 1, the substrate 102 is n-type and the drift region 104 is an n-type layer. In alternate implementations, the substrate 102 and the drift region 104 may have p-type doping instead.

In an implementation, the well region 106 has an opposite type of doping (p-type, for example) as the drift region 104 (n-type, for example). In various implementations, the well 106 also includes the back gate 114. In an implementation, the back gate 114 comprises a region adjacent to the channel 110 that is arranged to assist in closing or opening the channel 110, according to an applied voltage at the source 122 and/or the gate 124. In an implementation, the layer above the back gate 114 includes the channel region 110. The channel region 110 may have the same type of doping as the drift region 104, and may be continuous with the drift region 104.

For example, the illustration of FIG. 1 shows an example current flow through the transistor structure 100. In various implementations, current will flow through the transistor based on a potential between the source 122 and the drain 120. The current flows from the drain 120 through the substrate 102 and the drift region 104 to the current flow region 116 of the drift region 104. The current then flows to the channel region 110, which is located generally above the back gate 114. If the channel 110 is open, the current flows from the channel region 110 to the source region 108, and then to the source contact 122.

In an implementation, as shown in FIGS. 1 and 2A, the top gate 112 is located generally above the channel region 110. The top gate 112 is electrically coupled to the gate contact 124, and has the same type of doping as the back gate 114 (and opposite type of doping as the channel 110 and drift region 104). In one implementation, by applying a preselected voltage between the source contact 122 and the gate contact 124, the top gate 112, along with the back gate 114, pinches off the channel 110, terminating current flow through the channel 110 (or reducing current flow or preventing current flow through the channel 110). When the preselected voltage is removed from between the source contact 122 and the gate contact 124, the channel 110 opens, restoring current flow through the channel 110 (or increasing current flow or allowing current to flow through the channel 110).

In an alternate implementation, the transistor structure 100 may be arranged such that the channel 110 is closed to current flow unless a preselected voltage is applied to the source contact 122 and gate contact 124 of the transistor structure 100. In other implementations, the transistor structure 100 may be arranged such that other potentials or currents are applied to one or more contacts (e.g., 120, 122, 124) of the transistor structure 100 for current to flow through the transistor structure 100.

As shown in FIGS. 1 and 2A, the top gate 112 may be located generally above the channel region 110, and may extend beyond the channel region 110 a distance ("Xgate") to overlap the current flow region 116 and the drain region 120 that lies beneath the current flow region 116. In FIG. 2A, the overlap distance Xgate is indicated by the dashed lines. In various implementations, the gate-to-drain capacitance Cgd and/or the gate-to-drain charge Qgd of the transistor structure 100 are based on the distance that the top gate 112 extends beyond the back gate 114. In other words, the gate-to-drain capacitance Cgd and/or the gate-to-drain charge Qgd of the transistor structure 100 are based on the overlap distance Xgate of the top gate 112 over the drain region 120 that lies beneath the current flow region 116.

Example Reduced Charge Transistor Structure

In various implementations, a transistor structure 100 may be designed such that the gate-to-drain capacitance Cgd and/or the gate-to-drain charge Qgd of the transistor structure 100 is reduced (resulting in improved switching times and reduced or eliminated unintended switching) while maintaining the performance characteristics (e.g., transfer characteristic, breakdown voltage, etc.) of the transistor structure 100.

Figure 2B:
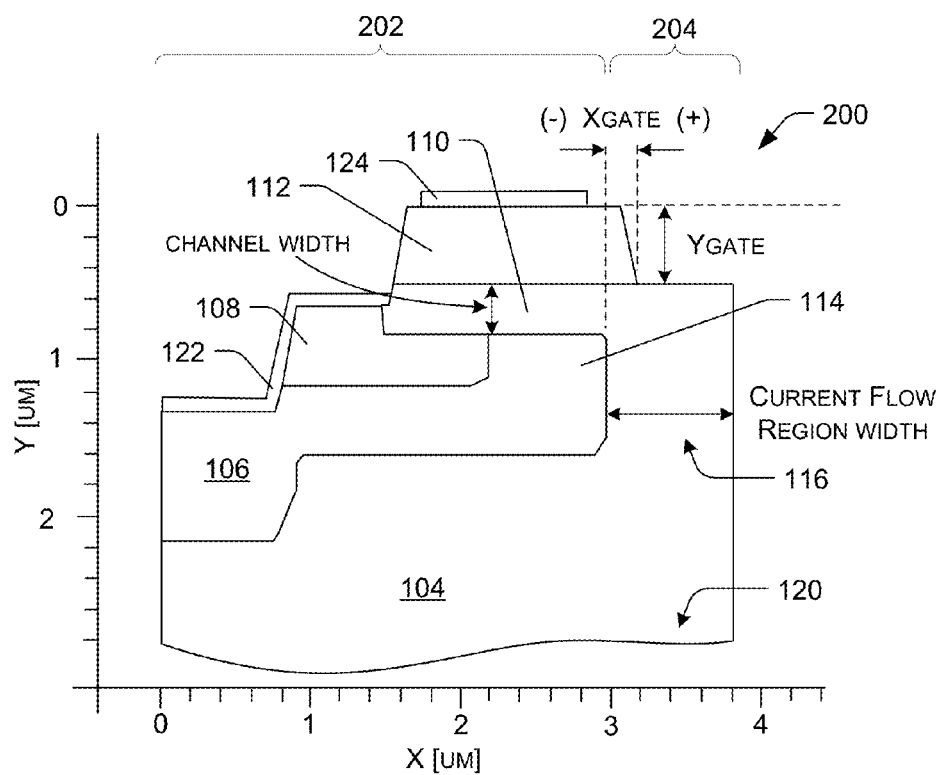
FIG. 2B is a profile view of a portion of an example transistor structure according to another implementation. The illustration of FIG. 2B represents one half of a transistor cell having a reduced charge and/or capacitance according to the implementation.

FIG. 2B is a profile view of a portion of an example transistor structure 200 according to an implementation. In the implementation, the transistor structure 200 comprises the transistor structure 100, as described above, except with adjusted dimensions of the top gate 112. In an implementation, adjusting one or more dimensions of the top gate 112 reduces the gate-to-drain capacitance Cgd and/or the gate-to-drain charge Qgd of the transistor structure 100. The transistor structure 200 is illustrated in FIG. 2B with a scale showing example dimensions of the transistor structure 200 in microns (um). This is an example, and not intended to be limiting. In various implementations, a transistor structure 200 may have other dimensions, and remain within the scope of the disclosure.

The techniques and devices described with respect to a transistor structure 200 are also applicable to a single transistor device, and the like. For example, the illustration of FIG. 2B shows a half transistor cell of a transistor structure 200. This is not intended to be a limitation, and the techniques and devices disclosed are also applicable to other single transistors or multiple transistor combinations.

As shown in FIG. 2B, a transistor structure 200 or single transistor device may be discussed in terms of a first region 202 and a second region 204. The delineation of the first region 202 and the second region 204 as illustrated in FIG. 2B is generalized for discussion purposes. Generally, the first region 202 is intended to include the well 106 and back gate 114, and the second region 204 is intended to include the current flow region 116 of the drift region 104 and the portion of the drain region 120 that lies beneath the current flow region 116. In various implementations, the first region 202 and/or the second region 204 may include more or less of the transistor structure 200. Further, in alternate implementations, the regions (202, 204) may overlap at one or more locations.

Referring to FIG. 2B, in an implementation, a transistor structure 200 includes a drift region layer 104 arranged on a substrate 102 (as shown in FIG. 1). The drift region layer 104 includes a first region 202 and a second region 204, and the substrate 102 is coupled to a drain 120. A back gate 114 is formed at the first region 202 of the drift region layer 104. In an implementation, as discussed above, the back gate 114 and the top gate 112 have a first type of doping and the drift region layer 104 and the channel 110 have a second type of doping.

In the implementation, a channel 110 is arranged overlying the back gate 114. In one example, the channel 110 is electrically coupled to the second region 204 of the drift region layer 104, which is coupled to the substrate 102. The channel 110 is also electrically coupled to the source contact 122.

A top gate 112 overlies the channel 110 and at least a portion of the first region 202 of the drift region layer 104, without fully overlying the second region 204 of the drift region layer 104. As discussed above, the top gate 112 may be arranged, as shown in FIG. 2B, to overlay the channel region 110 and the back gate 114. In an implementation, the top gate 112 is electrically coupled to the gate contact 124 and the back gate 114 is electrically coupled to the source contact 122.

The top gate 112, along with the back gate 114, may be arranged to pinch off the channel region 110 (i.e., deplete the channel 110) when a preset voltage is applied between the source contact 122 and the gate contact 124, for example. Accordingly, the top gate 112 and the back gate 114 may be substantially aligned, with the channel 110 positioned between them. In various implementations, the top gate 112 need not extend beyond the back gate 114 (i.e., extend into the second region 204) to pinch off the channel 110 with the back gate 114.

As shown in FIG. 2B, the top gate 112 overlaps the current flow region 116 and a portion of the drain region 120 that lies beneath the current flow region 116 for a distance Xgate. In other words, the top gate 112 overlaps the second region 204 a distance Xgate. In an implementation, the distance Xgate is minimized to reduce the gate-to-drain capacitance Cgd and/or the gate-to-drain charge Qgd of the transistor structure 200. In other words, the second region 204, including the portion of the drain region 120 that lies beneath the current flow region 116, is not fully overlapped by the top gate 112. In an implementation, the smaller the distance Xgate, the lower the gate-to-drain capacitance Cgd and/or the gate-to-drain charge Qgd of the transistor structure 200.

In one implementation, referring to the arrangement shown in FIG. 2B, the overlap Xgate of the top gate 112 extending beyond the back gate 114 is in the range of between −10% and +50% of the width of the current flow region 116. In alternate implementations and/or arrangements, the overlap Xgate of the top gate 112 may be a different percentage or ratio of the width of the current flow region 116.

In an implementation, the transistor device 200 also includes a source region 108 overlying at least a portion of the back gate 114. The source region 108 is coupled to the channel 110, the source region 108 is coupled to the source contact 122 and the channel 110 is coupled to the source contact 122 or to the source region 108, or to both regions. In an implementation, the source region 108 is more highly doped than the drift region 104 or the substrate 102. In one implementation, this facilitates the flow of current from the substrate 102, through the drift region 104, and to the source region 108. In alternate implementations, the source region 108 may have a different doping characteristic relative to the drift region 104 and/or the substrate 102.

In various implementations, a transistor structure 200 may include additional or alternative components to accomplish the disclosed charge reduction techniques and arrangements.

Example Performance Characteristics

As mentioned previously, a transistor structure 200 (including a single transistor device) may be designed such that the gate-to-drain capacitance Cgd and/or the gate-to-drain charge Qgd of the transistor structure 200 is reduced (relative to a transistor structure 100) while maintaining desired performance characteristics (e.g., transfer characteristic, breakdown voltage, etc.). Several graphs are included to illustrate this. Most of the graphs in the figures include normalized values for ease of discussion and better illustration of the relative characteristics.

Figure 3:
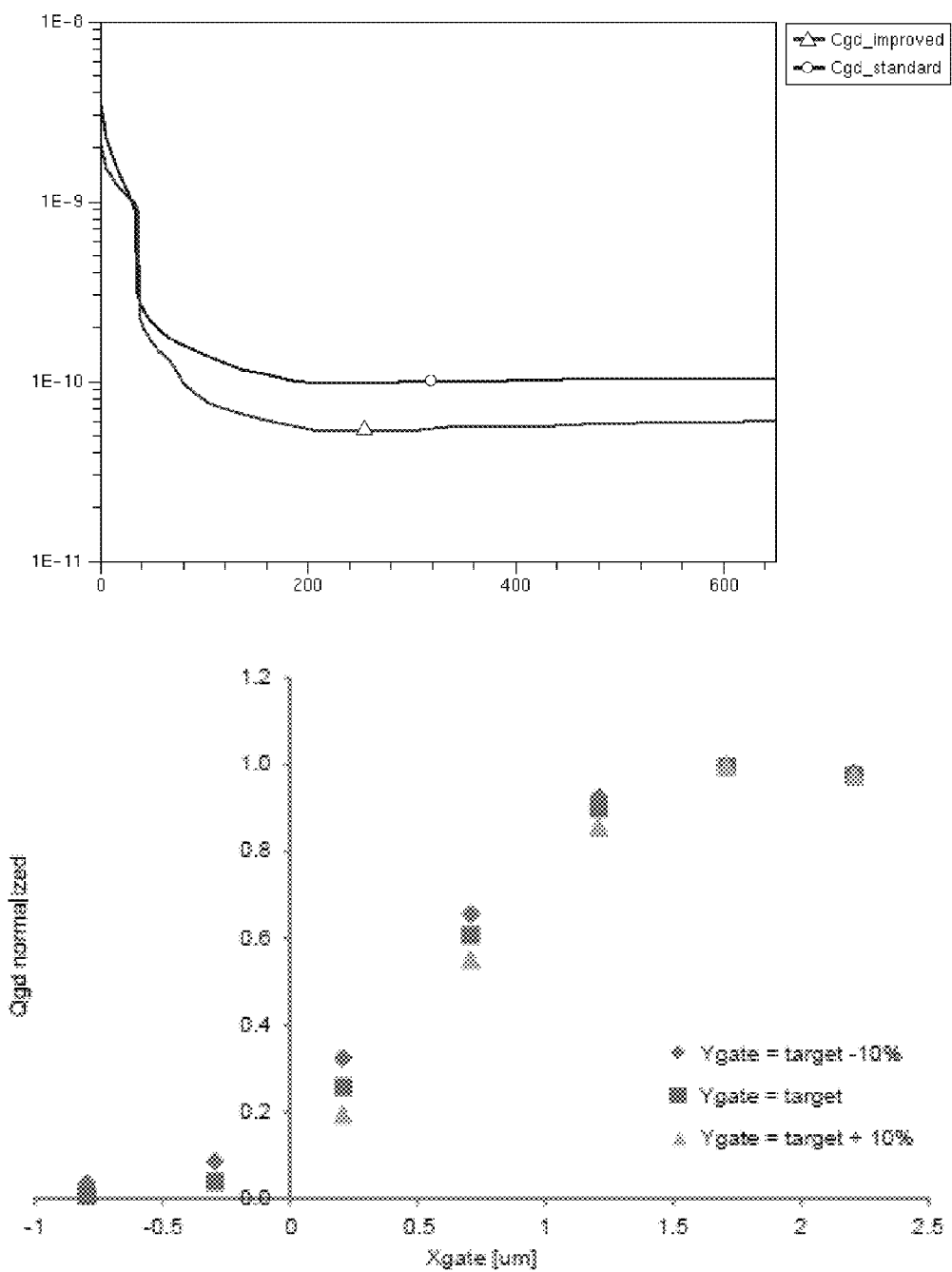
FIG. 3 shows two graphs illustrating example performance of a transistor device, according to an implementation. The top graph illustrates the difference in capacitance of the transistor device with and without the techniques described herein applied. The bottom graph illustrates the gate-to-drain charge of a first example transistor device for various top gate overlaps, and three top gate depths, with the techniques described herein applied.

FIG. 3 shows two graphs illustrating example performance of a transistor structure 200, according to an implementation. The top graph of FIG. 3 illustrates the difference in the gateto-drain capacitance Cgd of the transistor structure 200 with ("improved") and without ("standard") the techniques described herein applied. The x-axis represents the drain-to-source voltage Vds of an example transistor structure 200 device rated at approximately 650V.

As shown in the top graph of FIG. 3, the gate-to-drain capacitance Cgd of the example transistor structure 200 device is substantially reduced when the top gate 112 is adjusted (e.g., shortened, etc.) to minimize the overlap of the top gate 112 to the drain region 120 that lies beneath the current flow region 116.

In an implementation, the reduction in the gate-to-drain capacitance Cgd results in a reduction of the gate-to-drain charge Qgd within the transistor structure 200. This is illustrated for several values of Xgate (overlap distance) and Ygate (recess depth or layer thickness of the top gate 112) in the bottom graph of FIG. 3. In one implementation, the recess depth Ygate of the top gate 112 is determined by removing a portion (the portion that overlaps the drain region 120 that lies beneath the current flow region 116) of the top gate 112 to a desired depth. In alternate implementations, the recess depth Ygate of the top gate 112 is determined by other techniques, including depositing one or more layers or regions over the channel region 110, combinations of deposition and removal, and the like.

The bottom graph of FIG. 3 illustrates the gate-to-drain charge Qgd (in nano-coulombs) of an example transistor structure 200 (rated at 1200V) with the techniques described herein applied. The graph shows the gate-to-drain charge Qgd for various top gate 112 overlaps Xgate (in microns), and for three example values of top gate 112 recess depth or thickness Ygate (target−10%, target, and target+10%). As shown in the bottom graph of FIG. 3, the gate-to-drain charge Qgd of the example transistor structure 200 device is substantially reduced with a reduction in the top gate 112 overlap Xgate of the drain region 120 that lies beneath the current flow region 116. This effect can be seen for each of the example top gate 112 recess depth or thickness values. The shorter the overlap Xgate, the smaller the gate-to-drain charge Qgd of the example transistor structure 200. Further, the gate-to-drain charge Qgd may be reduced to nearly zero by using a top gate 112 that has a slight negative overlap Xgate.

Figure 4:
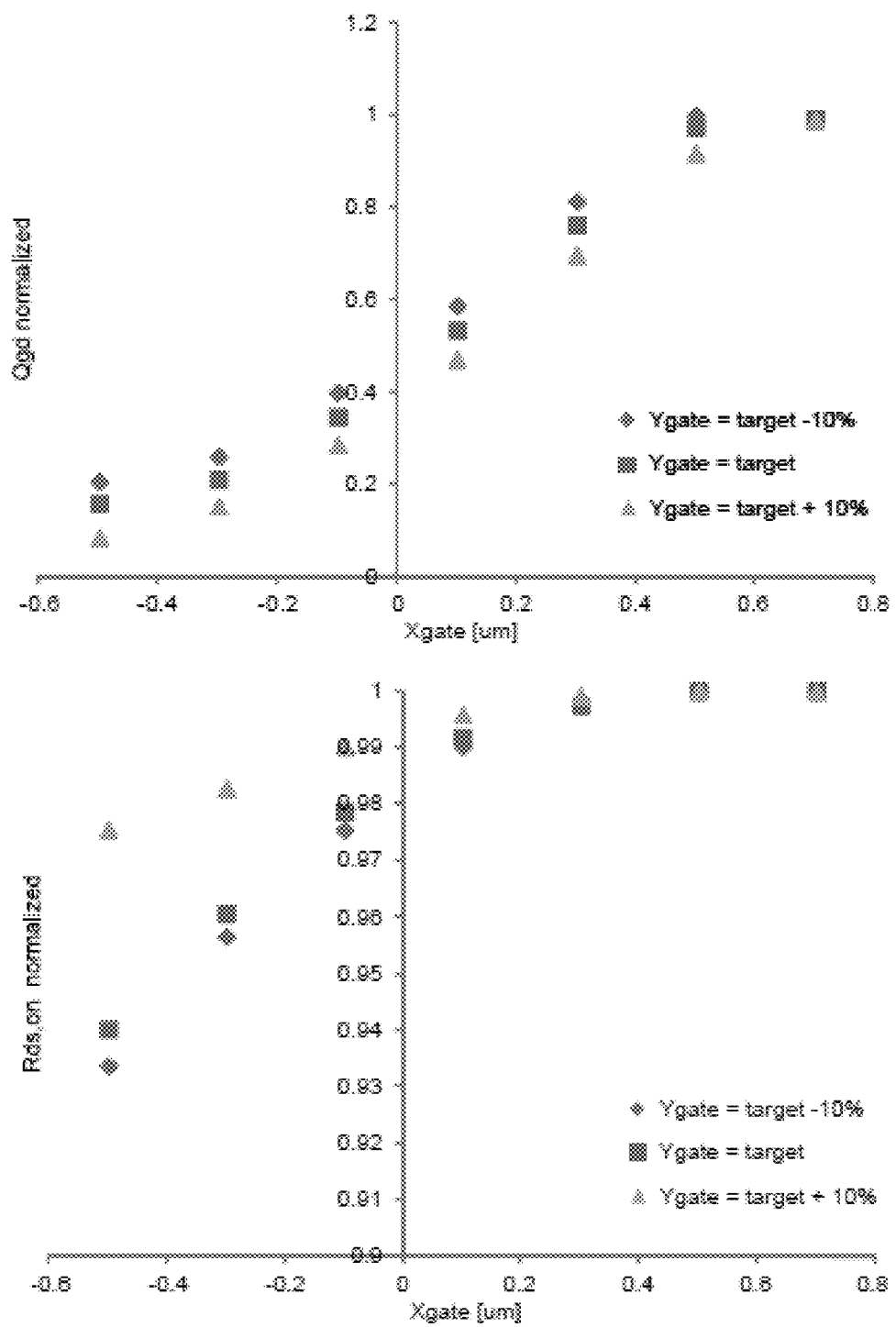
FIG. 4 shows two graphs illustrating example performance of a transistor device, according to an implementation. The top graph illustrates the gate-to-drain charge of a second example transistor device for various top gate overlaps, and three top gate depths, with the techniques described herein applied. The bottom graph illustrates the drain-to-source on-resistance of the transistor device for various top gate overlaps, and three top gate depths, with the techniques described herein applied.

The top graph of FIG. 4 illustrates the gate-to-drain charge Qgd (in nano-coulombs) of an example transistor structure 200 (rated at 600V) with the techniques described herein applied. The graph shows the gate-to-drain charge Qgd for various top gate 112 overlaps Xgate (in microns), and for three example values of top gate 112 recess depth or thickness Ygate (target−10%, target, and target+10%). As shown in the top graph of FIG. 4, the gate-to-drain charge Qgd of the example transistor structure 200 device is substantially reduced with a reduction in the top gate 112 overlap Xgate of the drain region 120 that lies beneath the current flow region 116. This effect can be seen for each of the example top gate 112 recess depths or thickness values. The shorter the overlap Xgate, the smaller the gate-to-drain charge Qgd of the example transistor structure 200.

The remaining graphs illustrate the effects on performance characteristics of a transistor structure 200 with the techniques described herein applied. The bottom graph of FIG. 4 illustrates the drain-to-source on-resistance Rds of the transistor device for various top gate 112 overlaps Xgate, and three top gate recess depths or thicknesses Ygate. As seen in the graph, the on-resistance is substantially constant and low for various values of Xgate and Ygate.

Figure 5:
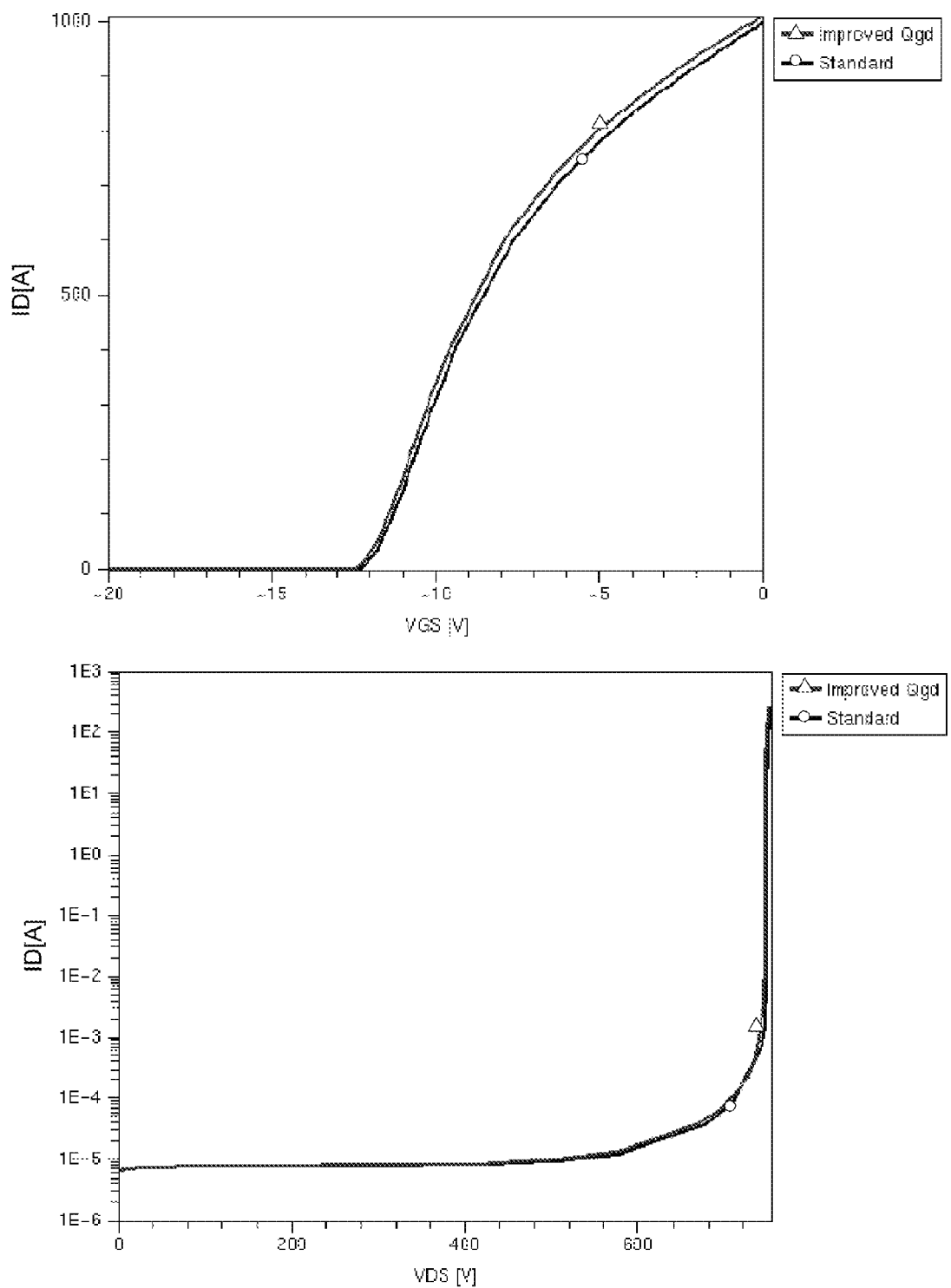
FIG. 5 shows two graphs illustrating example performance of a transistor device, according to an implementation. The top graph illustrates the transfer characteristic of the transistor device with and without the techniques described herein applied. The bottom graph illustrates the breakdown characteristics of the transistor device with and without the techniques described herein applied.

FIG. 5 shows two graphs illustrating example performance of a transistor device, with ("improved") and without ("standard") the techniques described herein applied, according to an implementation. The top graph illustrates the transfer characteristic of the transistor device. The y-axis represents the drain current Id and the x-axis represents the gate-to-source voltage Vgs. The bottom graph illustrates the breakdown characteristics of the transistor device. The y-axis represents the drain current Id and the x-axis represents the drain-to-source voltage Vds. As shown in the graphs, these transfer characteristics are substantially unaffected by adjusting (e.g., reducing a length) of the overlap Xgate of the top gate 112 with respect to the drain region 120 that lies beneath the current flow region 116.

Figure 6:
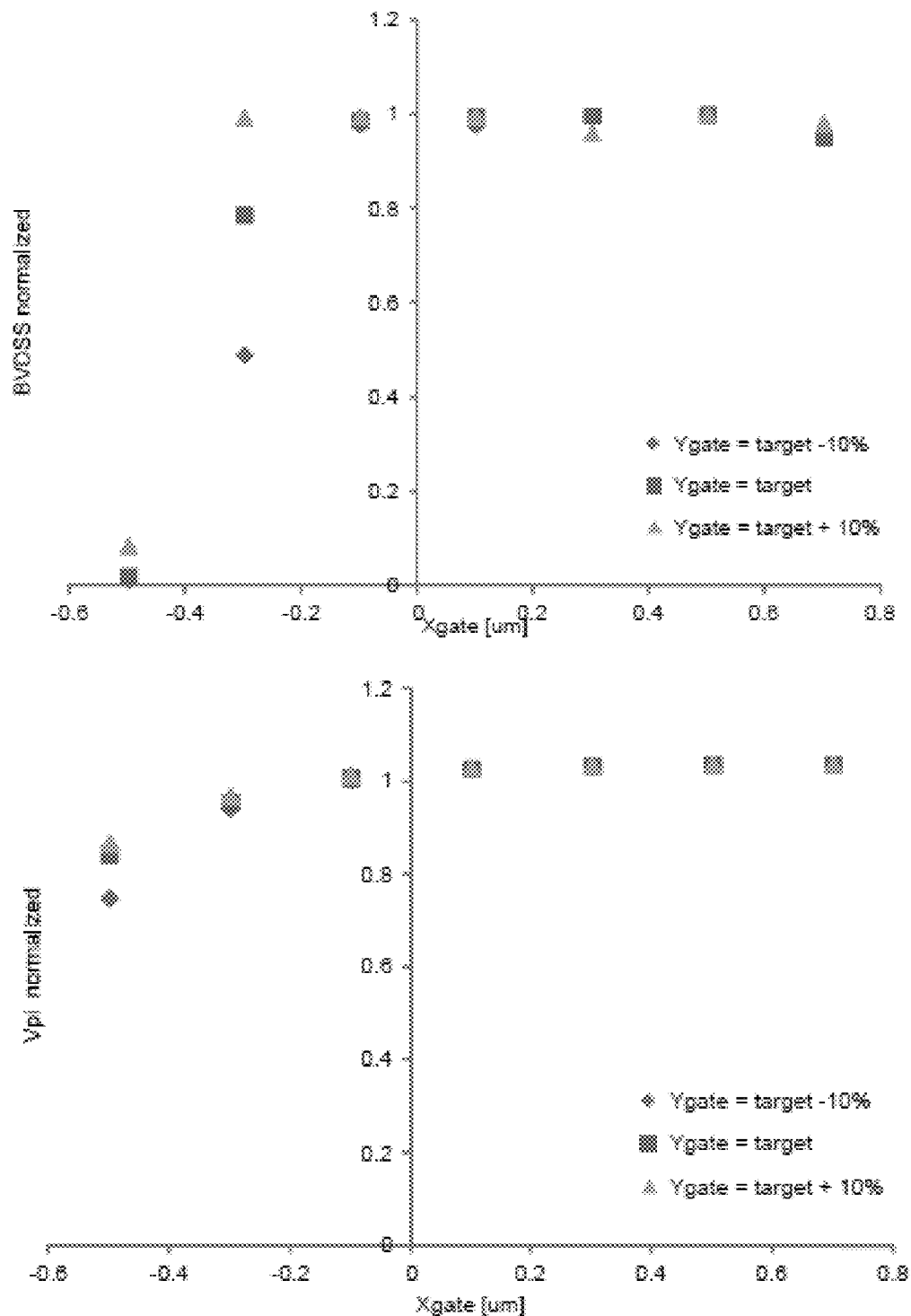
FIG. 6 shows two graphs illustrating example performance of a transistor device, according to an implementation. The top graph illustrates the breakdown voltage of a transistor device for various top gate overlaps, and three top gate depths, with the techniques described herein applied. The bottom graph illustrates the pinch-off voltage of the transistor device for various top gate overlaps, and three top gate depths, with the techniques described herein applied.

FIG. 6 shows two graphs illustrating example performance of a transistor structure 200, according to an implementation. The top graph illustrates the breakdown voltage BVDSS of the transistor structure 200 for various top gate 112 overlaps Xgate, at three example top gate recess depths or thicknesses Ygate, with the techniques described herein applied. The bottom graph illustrates the pinch-off voltage Vpi of the transistor structure 200 for various top gate 112 overlaps Xgate, and three example top gate recess depths or thicknesses Ygate, with the techniques described herein applied. As shown in the graphs of FIG. 6, for positive values of Xgate, (and slight negative values of Xgate) the breakdown voltage and the pinch-off voltage of the transistor structure 200 are substantially unaffected by adjusting (e.g., reducing a length) of the overlap Xgate of the top gate 112 with respect to the drain region 120 that lies beneath the current flow region 116.

In various alternate implementations, other results may be achieved by adjusting the overlap Xgate of the top gate 112 relative to the drain region 120 that lies beneath the current flow region 116. Further, other results may also be achieved by adjusting other components of the transistor structure 200 (e.g., the length and/or position of the back gate 114, the width of the current flow region 116, etc.).

Example Implementations

Figure 7:
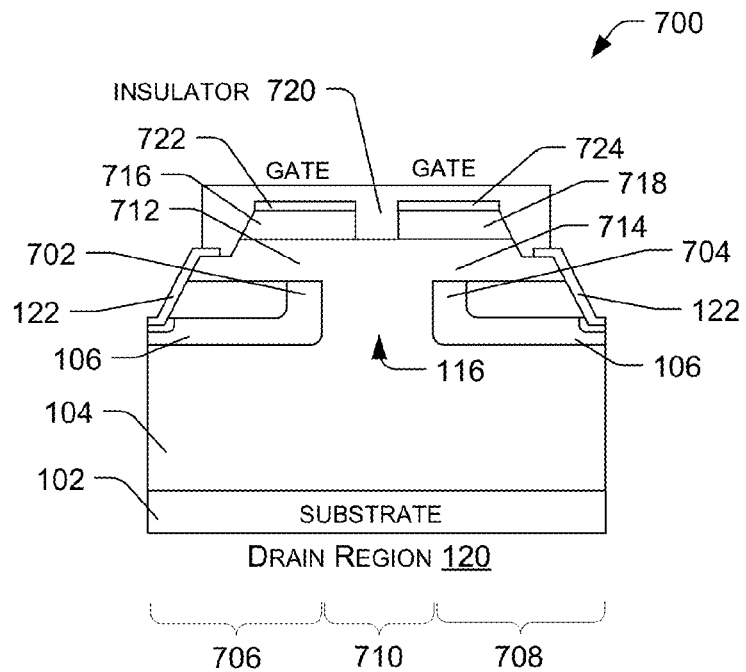
FIG. 7 shows profile views of two example transistor device implementations of the techniques and devices herein described.
Figure 7:
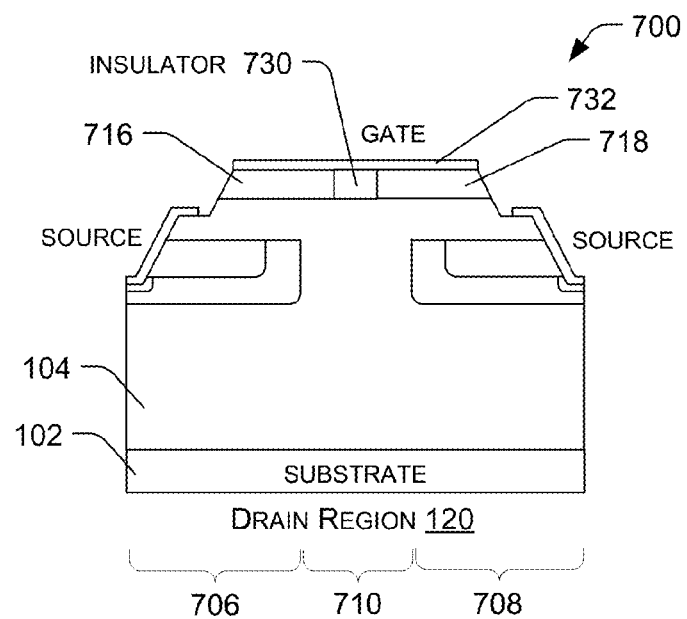
Figure 8:
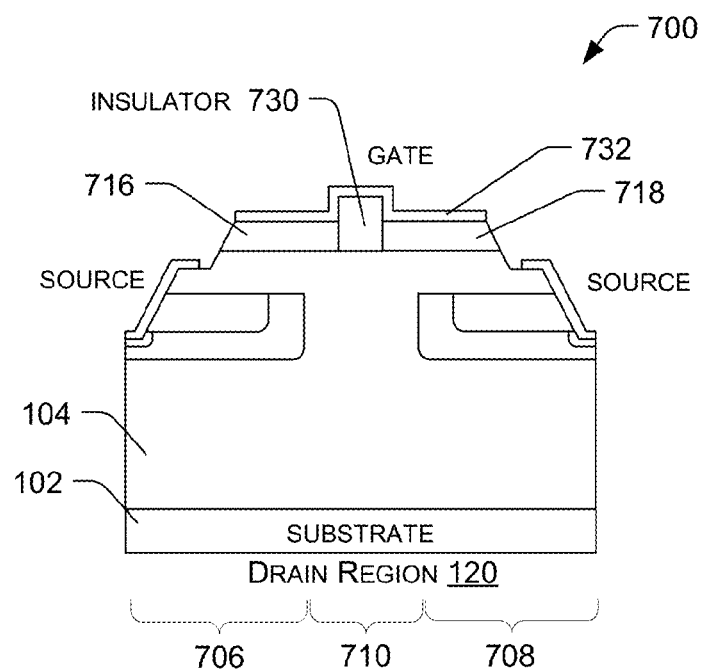
FIG. 8 shows profile views of two more example transistor device implementations of the techniques and devices herein described.
Figure 8:
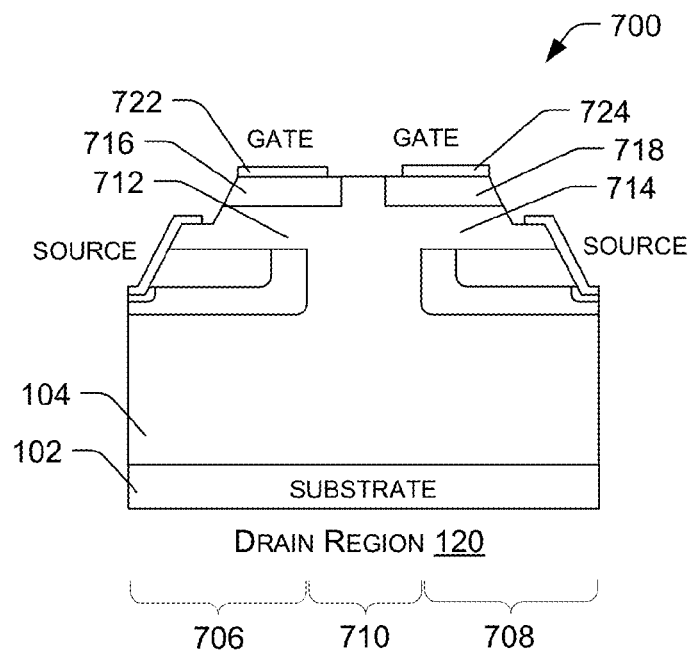

In various implementations, additional or alternate adjustments may be made to a transistor structure 200 to improve characteristics of the device, and the like. Four example implementations are shown in FIGS. 7 and 8. The example implementations are shown as transistor cells 700 for convenience. The transistor cells 700 are substantially equivalent to two transistor structures 200, placed back-to-back. The techniques described are also applicable to single or multiple transistor devices, alone or as part of multiple arrangements. In other implementations, other variations and techniques remain within the scope of the disclosure.

In the example implementations, as shown in FIGS. 7 and 8, a transistor cell 700 includes a drift region 104 having a first type of doping. A pair of wells 106 of a second type of doping are formed within the drift region 104. Each of the wells 106 include a back gate (702, 704) and each of the wells 106 are electrically coupled to a source contact 122.

In the example implementations, the transistor cell 700 includes a first back gate region 702 formed at a first part 706 of the drift region 104 and a second back gate region 704 formed at a second part 708 of the drift region 104. A third part of the drift region 710 is located between the first back gate region 702 and the second back gate region 704. In various implementations, the first 702 and second 704 back gate regions are equivalent to the back gate 114 discussed above. In an implementation, the third part 710 of the drift region 104 overlies a drain region 120.

In an implementation, the transistor cell 700 includes a first channel 712 overlaying the first back gate region 702 and a second channel 714 overlaying the second back gate region 704. In various implementations, the first 712 and second 714 channels are equivalent to the channel 110 discussed above. In an example, the channels (712, 714) have the first type of doping and are electrically coupled to the source contacts 122.

In an implementation, the transistor cell 700 includes a first top gate 716 overlaying the first channel 712 and overlaying at least a portion of the first back gate region 702 and a second top gate 718 overlaying the second channel 714 and overlaying at least a portion of the second back gate region 704. In an implementation, at least a portion of the third part 710 of the drift region 104 is not overlaid by either the first top gate 716 or the second top gate 718. In an implementation, the first 716 and second 718 top gates have the second type of doping, and are electrically coupled to a gate contact. In various implementations, as discussed below, the gate contact may have different configurations. Additionally, in various implementations, the gate contact (including when the gate contact is implemented as a "metallization layer") may be comprised of a conductive material such as a metallic material, a semiconductor material (such as a highly-doped polysilicon, metal silicide, etc.), or the like.

In an implementation, the back gates (702, 704) are arranged with the top gates (716, 718) to pinch-off the pair of channels (712, 714), at least in a region where the top gates (716, 718) overlay the back gates (702, 704), when a potential is applied to the top gates (716, 718) with reference to the back gates (702, 704). For example, in an implementation, a channel (712, 714) is pinched-off when a preset voltage is applied between the gate contact (722, 724) and the source contact 122 associated with the channel (712, 714).

In an implementation, the transistor cell 700 includes a drain region 120 coupled to the drift region 104, wherein at least a portion of the drain 120 is not overlaid by either of the pair of top gates (716, 718). In other words, the pair of top gates (716, 718) combined do not fully overlay the drain region 120.

In various implementations, the arrangement of the first top gate 716 and the second top gate 718 relative to the drain region 120 reduces a capacitance (e.g., the gate-to-drain capacitance Cgd) of the transistor cell 700, as discussed above with respect to transistor structures 100 and 200. Further, the gate-to-drain charge Qgd of the transistor cell 700 is based on an overlap of the first top gate 716 over the third part 710 of the drift region 104 and/or an overlap of the second top gate 718 over the third part 710 of the drift region 104, as also discussed above. For example, the gate-to-drain capacitance Cgd and/or the gate-to-drain charge Qgd of the transistor cell 700 is reduced as the overlap of the first top gate 716 and/or the overlap of the second top gate 718 is reduced relative to the third part 710 of the drift region 104. In one implementation, the overlap of the first top gate 716 relative to the first back gate region 702 and the overlap of the second top gate 718 relative to the second back gate region 704 is based on a preselected fraction of a carrier path width (i.e., the current flow region 116 width) at the third part 710 of the drift region 104.

In an implementation, the transistor cell 700 has a substantially vertical configuration, and the first 712 and second 714 channels have a substantially lateral configuration, as discussed above with respect to transistor structures 100 and 200.

In one implementation, as shown at the top of FIG. 7, the transistor cell 700 includes a first metallization layer 722 overlaying the first top gate 716 without overlapping the third part 710 of the drift region 104 and a second metallization layer 724 overlaying the second top gate 718 without overlapping the third part 710 of the drift region 104. In other words, the top gate 112 and the gate contact 124, as discussed above, are split into two sections each (716 and 718) and (722 and 724) respectively. Further, a gate contact section (i.e., metallization layer) (722 or 724) is coupled to a top gate section (716, 718 respectively) without fully overlaying the third part 710 of the drift region 104 (not fully overlaying the drain region 120 that lies beneath the current flow region 116).

In an implementation, the center portion of the top gate may be removed (e.g., etched away, etc.) to form the two separate top gates (716, 718). In an example, the hole between the remaining two top gates is filled with an insulating material.

In the implementation, as shown at the top of FIG. 7, the transistor cell 700 includes an insulating layer 720 overlaying the first top gate 716, the second top gate 718, and the third part 710 of the drift region 104. For example, the insulating layer 720 may cover the top components of the transistor cell 700. In various implementations, the insulating layer 720 is comprised of an insulating material, such as a silicon-oxide, silicon dioxide, silicon oxynitride, or some other material which is electrically insulating.

In another implementation, as shown at the bottom of FIG. 7, the transistor cell 700 includes an insulating layer 730 overlying the third part 710 of the drift region 104. For example, the insulating layer 730 at least partially fills an area between the first top gate 716 and the second top gate 718. In the implementation, the insulating layer 730 does not cover the top components of the transistor cell 700, such as the first 716 and second 718 top gates. In an implementation, the insulator 730 has a lesser thickness than the first 716 and/or second 718 top gates. In an example, the insulator 730 is recessed with respect to the first 716 and/or second 718 top gates. Accordingly, the overall thickness or height of the transistor cell 700 is reduced with respect to the previous implementation shown at the top of FIG. 7.

In the implementation, the transistor cell 700 includes a metallization layer 732 overlaying the first top gate 716, the insulating layer 730, and the second top gate 718. In an implementation the metallization layer 732 is the gate contact, and is continuous across the first top gate 716, the insulating layer 730, and the second top gate 718.

In another implementation, as shown at the top of FIG. 8, the transistor cell 700 includes the insulating layer 730, and the thickness of the insulating layer 730 is greater than the thickness of the first top gate 716 and greater than the thickness of the second top gate 718. In the implementation, the metallization layer 732 conforms to the greater thickness of the insulating layer 730, with respect to the first top gate 716 and the second top gate 718. For example, since the thickness of the insulating layer 730 is greater than that of the top gates (716, 718), the metallization layer (i.e., gate contact) 732 is not level across the first top gate 716, the insulating layer 730, and the second top gate 718. Rather, the metallization layer 732 includes a "high-point" as shown at the top of FIG. 8.

In another implementation, as shown at the bottom of FIG. 8, the transistor cell 700 does not include insulation between the first 716 and second 718 top gates. Rather, a thickness of the third part 710 of the drift region 104 extends to at least partially fill the area between the first top gate 716 and the second top gate 718. For example, the semiconductor material comprising the drift region 104 fills the area between the first top gate 716 and the second top gate 718.

In one implementation, the top gates (716, 718) are formed by masking and implanting the region above the channels (712, 714) with an opposite doping type (i.e., p-type doping on an n-type channel region). This can form the two individual top gates (716, 718) and does not require etching a single top gate.

In the implementation, the transistor cell 700 includes the first metallization layer 722 overlaying the first top gate 716 without overlapping the third part 710 of the drift region 104 and a second metallization layer 724 overlaying the second top gate 718 without overlapping the third part 710 of the drift region 104. In the implementation, the first 722 and second 724 metallization layers comprise the gate contacts for the two halves of the transistor cell 700.

Representative Process

Figure 9:
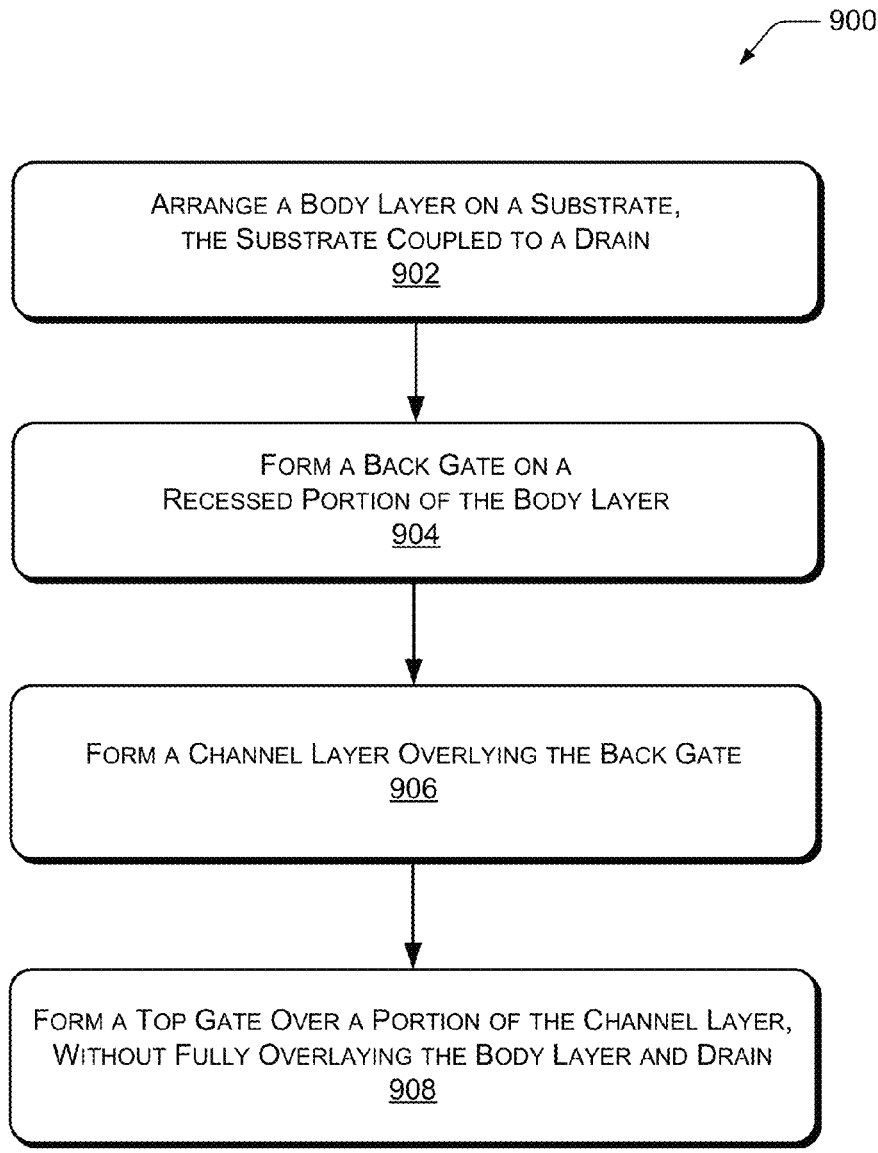
FIG. 9 is a flow diagram illustrating an example process for reducing the capacitance and/or charge on a transistor device, according to an implementation.

FIG. 9 illustrates a representative process 900 for reducing the capacitance and/or charge on a transistor structure (such as transistor structure 200, for example), according to an implementation. An example process 900 includes adjusting one or more dimensions of a top gate (such as top gate 122, for example) of a transistor structure. In various implementations, the length or overlap of the top gate is adjusted. The process 900 is described with reference to FIGS. 1-8.

The order in which the process is described is not intended to be construed as a limitation, and any number of the described process blocks can be combined in any order to implement the process, or alternate processes. Additionally, individual blocks may be deleted from the process without departing from the spirit and scope of the subject matter described herein. Furthermore, the process can be implemented in any suitable materials, or combinations thereof, without departing from the scope of the subject matter described herein.

At block 902, the process includes arranging a drift region layer (such as drift region 104, for example) on a substrate (such as substrate 102, for example), where the substrate is coupled to a drain (such as drain 120, for example).

At block 904, the process includes forming a back gate (such as back gate 114, for example) on a portion of the drift region layer. In one implementation, the process includes forming a well (such as well 106, for example) on the portion of the drift region layer, where the well includes the back gate. In an implementation, the well has an opposite type of doping (e.g., p-type, n-type) than the drift region and the substrate.

At block 906, the process includes forming a channel layer (such as channel 110, for example) overlying the back gate e.g. by epitaxial growth, implantation, or the like. In an implementation, the channel layer has a same type of doping as the drift region and substrate.

At block 908, the process includes forming a top gate (such as top gate 112, for example) over a portion of the channel layer, such that the top gate overlays the back gate, without fully overlaying the drift region layer and without fully overlaying the drain. In one implementation, the process includes minimizing an overlap of the top gate beyond the back gate. For example, the top gate may be substantially aligned with the back gate. The process includes minimizing a distance (i.e., the overlap) that the top gate extends beyond the back gate.

In one implementation, the process includes removing a part of the top gate which extends beyond the back gate and overlaps the drain. For example, the extending part of the top gate may be removed by wet or dry chemical etching, or the like. The more the extending part of the top gate is removed, the lower the gate-to-drain charge and the gate-to-drain capacitance of the transistor.

In an example, the process includes depleting the channel layer using the top gate and the back gate by applying a preset voltage between a gate and a source of the transistor. For instance, in an implementation, the top gate is electrically coupled to the gate and the back gate is electrically coupled to the source. By applying the preset voltage between the gate and source, the channel, which lies between the top gate and the back gate, is pinched-off.

In an implementation, the process includes reducing at least one of a gate-to-drain charge and a gate-to-drain capacitance of the transistor by minimizing an area of the top gate. For example, in an implementation, the lesser the distance of the overlap of the top gate over the drain region, the lower the gate-to-drain charge and the gate-to-drain capacitance of the transistor. Accordingly, the area of the top gate may be minimized to reduce the overlap of the top gate over the drain region.

In one implementation, the process includes modifying a ratio of a gate-to-drain charge to a gate-to-source charge by adjusting an area of the top gate. As discussed above, the lesser the distance of the overlap of the top gate over the drain region, the lower the gate-to-drain charge of the transistor. Accordingly, reducing the length of the top gate reduces the ratio of the gate-to-drain charge to the gate-to-source charge and increasing the length of the top gate increases the ratio of the gate-to-drain charge to the gate-to-source charge of the transistor.

In alternate implementations, other techniques may be included in the process 900 in various combinations, and remain within the scope of the disclosure.

CONCLUSION

Although the implementations of the disclosure have been described in language specific to structural features and/or methodological acts, it is to be understood that the implementations are not necessarily limited to the specific features or acts described. Rather, the specific features and acts are disclosed as representative forms of implementing example devices and techniques.

What is claimed is:

1. A transistor device, comprising:
a drift region layer arranged on a substrate, the drift region layer including a first region and a second region, the substrate coupled to a drain;
a back gate formed at the first region of the drift region layer;
a channel overlying the back gate, the back gate to at least deplete the channel;
a top gate overlying the channel, the top gate overlying at least a portion of the first region of the drift region layer without fully overlying the second region of the drift region layer.

2. The transistor device of claim 1, further comprising a source region overlying at least a portion of the back gate and coupled to the channel, the source region and the channel coupled to a source contact.

3. The transistor device of claim 1, wherein the channel is electrically coupled to the second region of the drift region layer, the channel is electrically coupled to a source contact, and the second region of the drift region layer is coupled to the substrate.

4. The transistor device of claim 1, wherein the top gate is electrically coupled to a gate contact, the back gate is electrically coupled to a source contact, and the top gate and the back gate are arranged to deplete the channel when a preset voltage is applied between the gate contact and the source contact.

5. The transistor device of claim 1, wherein the back gate and the top gate have a first type of doping and the drift region layer and the channel have a second type of doping.

6. A transistor cell, comprising:
a drift region arranged on a substrate;
a first back gate region formed at a first part of the drift region and a second back gate region formed at a second part of the drift region, a third part of the drift region located between the first back gate region and the second back gate region, the third part of the drift region overlying a drain region;
a first channel overlaying the first back gate region and a second channel overlaying the second back gate region;
a first top gate overlaying the first channel and overlaying at least a portion of the first back gate region and a second top gate overlaying the second channel and overlaying at least a portion of the second back gate region, at least a portion of the third part of the drift region is not overlaid by either the first top gate or the second top gate.

7. The transistor cell of claim 6, further comprising an insulating layer overlying the first top gate, the second top gate, and the third part of the drift region.

8. The transistor cell of claim 6, further comprising an insulating layer overlying the third part of the drift region, the insulating layer at least partially filling an area between the first top gate and the second top gate.

9. The transistor cell of claim 8, further comprising a conductive layer overlaying the first top gate, the insulating layer, and the second top gate.

10. The transistor cell of claim 9, wherein a thickness of the insulating layer is greater than a thickness of the first top gate and greater than a thickness of the second top gate, the metallization layer conforming to the greater thickness of the insulating layer with respect to the first top gate and the second top gate.

11. The transistor cell of claim 6, wherein a thickness of the third part of the drift region extends to at least partially fill an area between the first top gate and the second top gate.

12. The transistor cell of claim 11, further comprising a first metallization layer overlaying the first top gate without overlapping the third part of the drift region and a second metallization layer overlaying the second top gate without overlapping the third part of the drift region.

13. The transistor cell of claim 6, wherein the transistor cell has a substantially vertical configuration, and the first and second channels have a substantially lateral configuration.

14. The transistor cell of claim 6, wherein an arrangement of the first top gate and the second top gate relative to the drain region reduces a capacitance of the transistor cell.

15. The transistor cell of claim 6, wherein an overlap of the first top gate relative to the first back gate region and an overlap of the second top gate relative to the second back gate region is based on a preselected fraction of a carrier path width at the third part of the drift region.

16. The transistor cell of claim 6, wherein a gate-to-drain charge of the transistor cell is based on an overlap of at least one of the first top gate over the third part of the drift region and a second top gate over the third part of the drift region.

17. A method of forming a transistor, comprising:
arranging a drift region layer on a substrate, the substrate coupled to a drain;
forming a back gate on a portion of the drift region layer;
forming a channel layer overlying the back gate, the back gate to at least deplete the channel; and
forming a top gate over a portion of the channel layer, such that the top gate overlays the back gate, without fully overlaying the drift region layer and without fully overlaying the drain.

18. The method of claim 17, further comprising removing a part of the top gate which extends beyond the back gate and overlaps the drain.

19. The method of claim 17, further comprising minimizing an overlap of the top gate beyond the back gate.

20. The method of claim 17, further comprising reducing at least one of a gate-to-drain charge and a gate-to-drain capacitance of the transistor by minimizing an area of the top gate.

21. The method of claim 17, further comprising modifying a ratio of a gate-to-drain charge to a gate-to-source charge by adjusting an area of the top gate.

22. The method of claim 17, further comprising depleting the channel layer using the top gate and the back gate by applying a voltage between a gate and a source of the transistor.

23. A transistor device, comprising:
a drift region having a first type of doping;
a pair of wells of a second type of doping formed within the drift region, each of the wells including a back gate, each of the wells electrically coupled to a source contact;
a pair of top gates having the second type of doping and electrically coupled to a gate contact, the top gates layered over portions of the drift region that overlay the back gates and forming a pair of channels of the first type of doping, the channels formed between the back gates and the top gates and electrically coupled to the source contact, a portion of the drift region between the pair of wells not being overlaid by either of the pair of top gates.

24. The transistor device of claim 23, further comprising a drain coupled to the drift region, at least a portion of the drain not being overlaid by either of the pair of top gates.

25. The transistor device of claim 23, wherein the back gates are arranged with the top gates to pinch-off the pair of channels, at least in a region where the top gates overlay the back gates, when a potential is applied to the top gates with reference to the back gates.

26. The transistor device of claim 1, wherein the back gate is formed only in the first region of the drift region layer.

* * * * *